United States Patent [19]
Aoki et al.

[11] Patent Number: 5,514,620
[45] Date of Patent: May 7, 1996

[54] METHOD OF PRODUCING PN JUNCTION DEVICE

[75] Inventors: Kenji Aoki; Tadao Akamine; Naoto Saito, all of Tokyo, Japan

[73] Assignee: Seiko Instruments Inc., Tokyo, Japan

[21] Appl. No.: 210,769

[22] Filed: Mar. 21, 1994

Related U.S. Application Data

[63] Continuation of Ser. No. 935,122, Aug. 20, 1992, abandoned, which is a continuation of Ser. No. 620,621, Dec. 3, 1990, abandoned.

[30] Foreign Application Priority Data

Dec. 1, 1989 [JP] Japan ..................................... 1-313727

[51] Int. Cl.$^6$ ............................................... H01L 21/225
[52] U.S. Cl. ......................... 437/160; 437/946; 437/950
[58] Field of Search ................................. 437/160, 937, 437/939, 942, 946, 950; 148/DIG. 17, DIG. 34, DIG. 38, DIG. 144

[56] References Cited

U.S. PATENT DOCUMENTS

| | | | |
|---|---|---|---|
| 3,247,032 | 4/1966 | Griswold | 437/164 |
| 3,506,508 | 4/1970 | Nickl | 437/225 |
| 4,242,691 | 12/1980 | Kotani et al. | 257/327 |
| 4,395,433 | 7/1983 | Nagakubo et al. | 437/19 |
| 4,441,932 | 4/1984 | Akasaka et al. | 437/31 |
| 4,737,471 | 4/1988 | Shirato et al. | 437/953 |
| 4,791,074 | 12/1988 | Tsunashima et al. | 437/160 |
| 4,855,258 | 8/1989 | Allman et al. | 437/939 |
| 4,861,729 | 8/1989 | Fuse et al. | 437/165 |
| 4,940,505 | 7/1990 | Schachameyer et al. | 437/946 |
| 4,951,601 | 8/1990 | Maydon et al. | 118/719 |

FOREIGN PATENT DOCUMENTS

| | | |
|---|---|---|
| 0322921 | 5/1989 | European Pat. Off. |
| 316165A3 | 5/1989 | European Pat. Off. |
| 0413982 | 2/1991 | European Pat. Off. |
| 62-271475 | 11/1987 | Japan |
| 0166219 | 7/1988 | Japan |
| 0166220 | 7/1988 | Japan |
| 63-239939 | 10/1988 | Japan |
| 1192159 | 8/1989 | Japan |
| 1384206 | 2/1975 | United Kingdom |

OTHER PUBLICATIONS

Ito, T., "UV Epitaxy Applied to make Transistor," Nikkei High Tech Report, p. 10, Feb. 13, 1989.
Wolf et al, "Silicon Processing for the VLSI Era", pp. 264–265, p. 520, 1986.
S. K. Ghandhi, "VLSI Fabrication Principles", pp. 234–235, 1983.
English translation of Ito—JP-63-166220.
"Metal–Oxide–Silicon Field-Effect Transistor Made By Means Of Solid–Phase Doping", by Gong et al.; J. Appl. Phys. 65 (11), 1 Jun. 1989.
J. Nishizawa, "Ultrashallow, high dpoing of boron using molecular layer doping", Applied Physics Letters, Apr. 2, 1990, No. 14, p. 1334.

*Primary Examiner*—Chandra Chaudhari
*Attorney, Agent, or Firm*—Loeb & Loeb

[57] ABSTRACT

A PN junction device is formed by removing an inert film from a surface of an N type semiconductor layer to expose an active face, then applying a source gas containing an P type impurity component to the active face to form an impurity adsorption film, and thereafter carrying out a solid-phase diffusion of the impurity is carried out from a diffusion source composed of the P type impurity adsorption film into the N type semiconductor layer to form therein a P type semiconductor layer to thereby provide a PN junction. Lastly, a pair of electrodes are connected to the respective semiconductor layers to form the an PN junction device.

8 Claims, 6 Drawing Sheets

F I G. 2
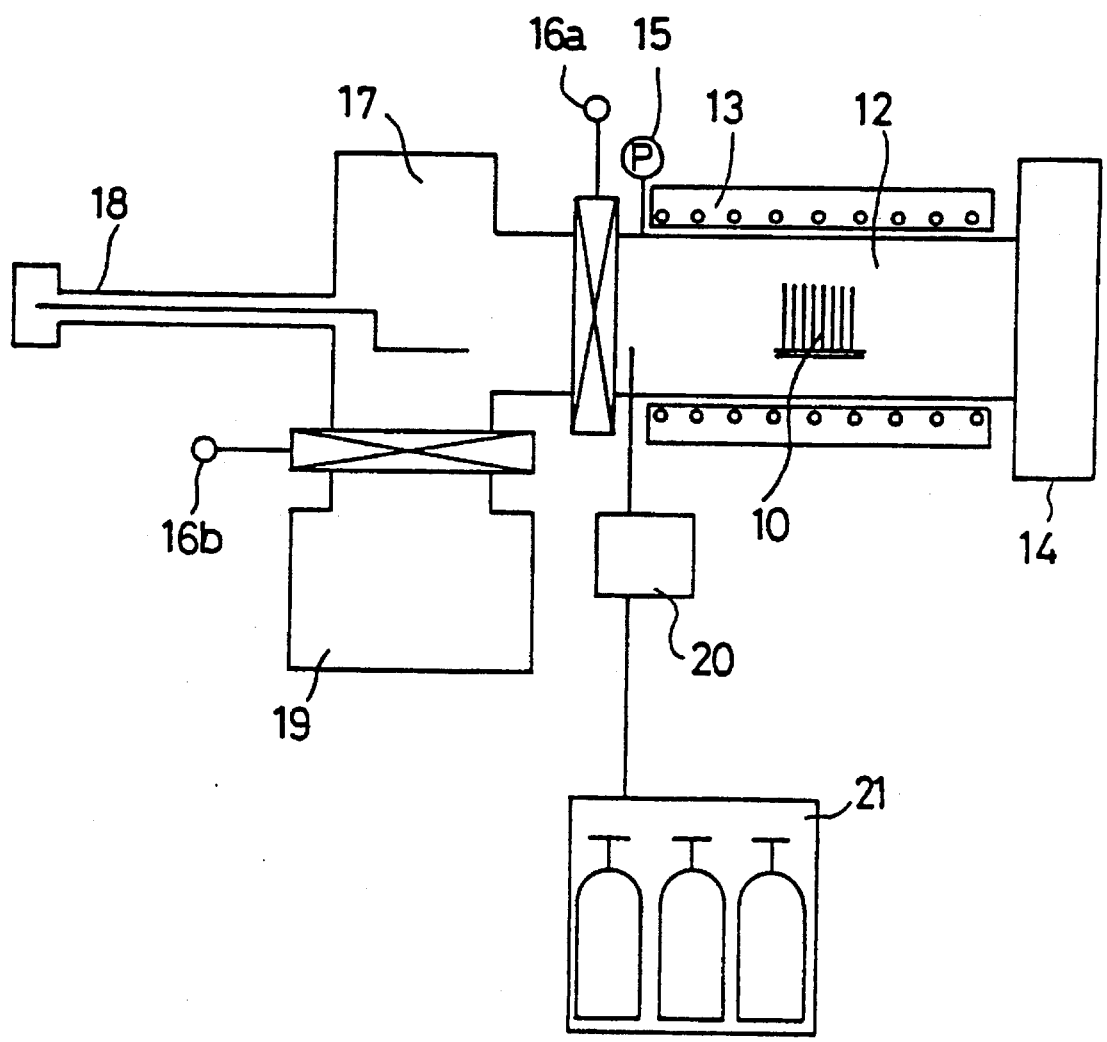

5,514,620

METHOD OF PRODUCING PN JUNCTION DEVICE

This is a continuation of application Ser. No. 07/935,122, filed on Aug. 20, 1992, and now abandoned, which is itself a continuation of application Ser. No. 07/620,621, filed on Dec. 2,1990, now abandoned.

BACKGROUND OF THE INVENTION

The present invention relates to methods of producing semiconductor PN junction devices, and more specifically relates to PN junction types of rectifier devices, tunnel rectifier devices, photoelectric conversion devices and capacitor devices.

In the fabrication of a conventional PN junction device a surface portion of a semiconductor layer of one conductivity type is doped with an impurity of the opposite conductivity type by means of ion implantation or conventional diffusion technology.

However, impurity doping by ion implantation has certain drawbacks, including: the semiconductor layer surface is damaged due to kinetic energy of the doping impurity; a shallow diffusion layer cannot be easily formed due to the occurrence of channeling; and a steep impurity concentration profile cannot be created in a deep portion because the doped impurity is distributed in the form of a Gaussian distribution having a variance determined by the acceleration energy.

In turn, the conventional diffusion technology has drawbacks such as, for example, that the diffusion density and junction depth cannot be accurately controlled because the impurity doping is carried out generally through an oxide film barrier over the semiconductor layer surface.

SUMMARY OF THE INVENTION

In view of the above noted drawbacks of the prior art, an object of the present invention is to provide a method of producing a PN junction device having excellent performance by utilizing a new impurity doping technology.

The above and other objects are achieved, according to the invention, by a method of producing a PN junction device, comprising:

providing a semiconductor layer of a first conductivity type having a surface and provided with an inert film on the surface;

removing the inert film from the surface of the semiconductor layer of the first conductivity type to expose an active surface of the semiconductor layer;

applying to the active surface a gas containing an impurity component of a second conductivity type opposite to the first conductivity type to form an impurity adsorption film constituting a diffusion source;

carrying out solid-phase diffusion of the impurity component from the diffusion source into the semiconductor layer of the first conductivity type to form another semiconductor layer of the second conductivity type to thereby form a PN junction between the semiconductor layer of the first conductivity type and the other semiconductor layer of the second conductivity type; and connecting a respective electrode to each semiconductor layer.

BRIEF DESCRIPTION OF THE DRAWING

FIG. 2 is a simplified pictorial view showing a apparatus for producing PN junction devices according to the invention.

DESCRIPTION OF THE PREFERRED EMBODIMENTS

Referring to FIGS. 1A–1E, one example of the method of producing a PN junction device according to the invention will be described.

Figure 1A:
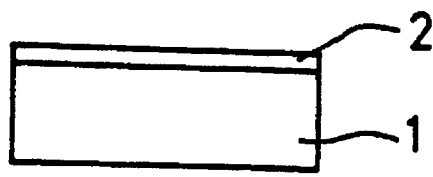
FIGS. 1A–1E are simplified pictorial views illustrating basic process steps for producing a PN junction device according to the invention.

In the step of FIG. 1A, there is provided a substrate having a semiconductor layer 1 of a first conductivity type. The semiconductor layer 1 is normally covered on its surface with an inert film 2. The inert film 2 is a natural oxide film of silicon in case that the semiconductor layer 1 is composed of silicon single crystal.

Figure 1B:

In the step of FIG. 1B, the substrate is disposed in a vacuum and heated to remove the inert film 2 from the surface of the semiconductor layer 1 of the first conductivity type to thereby expose an active face of the semiconductor layer 1. This exposure process is important as a pretreatment for the next adsorption step.

Figure 1C:
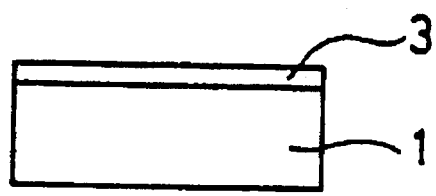

In the step of FIG. 1C, a gas containing an impurity component is applied to the exposed active face to form an impurity adsorption film 3. This step is carried out, for example, by applying diborane gas containing an impurity component of boron to the active face of the semiconductor layer 1 composed of silicon to form the impurity adsorption film 3 composed of or containing boron atoms. The semiconductor layer 1 is heated during the course of the processing to effect thermal dissociation of diborane and adsorption of the impurity.

Figure 1D:
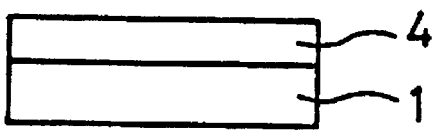

In the step of FIG. 1D, solid-phase diffusion of the impurity is carried out from a diffusion source in the form of the impurity adsorption film 3 into the bulk of the semiconductor layer 1 of the first conductivity type to form therein another semiconductor layer 4 of the second conductivity type, opposite to the first conductivity type, to thereby produce a PN junction. The impurity diffusion is carried out by heating. The impurity density profile can be freely controlled in the depth direction of the second conductivity type semiconductor layer 4 by adjusting or regulating the impurity adsorption amount contained in the impurity adsorption film 3. The adjustment or regulation of the impurity adsorption amount can be effected by selecting the substrate temperature and controlling the pressure and application time interval of the impurity source gas.

Figure 1E:
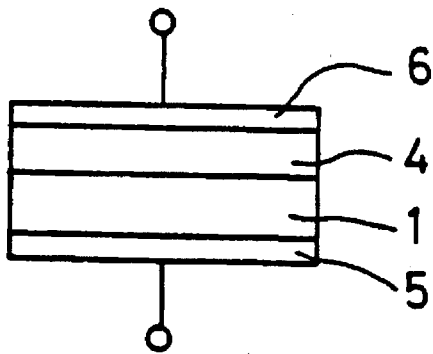

In the last step of FIG. 1E, a pair of electrodes 5 and 6 are connected, respectively, to the first conductivity type semiconductor layer 1 and to the second conductivity type semiconductor layer 4 to thereby complete a PN junction device. The above described fabrication method of a PN junction device can be applied to the production of various PN junction types of rectifier diodes, tunnel diodes, photoelectric converters and capacitors.

FIG. 2 shows a fabrication apparatus for carrying out sequentially the above described steps for producing the PN junction device.

As shown in the FIG. 2, a substrate 10 having a semiconductor layer of the first conductivity type is set in a central portion of a vacuum chamber 12 made of quartz. The temperature of the substrate 10 can be set to a desired level by regulating a heating system 13 of the infrared ray lamp heater type or the resistance heater type. The chamber 12 is evacuated to a high vacuum state by means of a high vacuum system 14 composed of a plurality of pumps including a main pump in the form of a turbo-molecular pump. The degree of vacuum in of the chamber 12 is continuously monitored by a pressure gage 15.

The silicon substrate 10 is transported by means of a transportation mechanism 18 to the vacuum chamber 12 from a loading chamber 17 which is connected to the chamber 12 through a gate valve 16a. The loading chamber 17 is normally evacuated to a high vacuum state by opening another gate valve 16b to place loading chamber 17 in communication with a vacuum system 19 Gate valve 16b is closed during transport of substrate 10 to the loading chamber 17 and from loading chamber 17 to vacuum chamber 12.

A gas source 21 is connected to chamber 12 through a gas flow control system 20. The gas source 21 includes a plurality of gas bottles containing various source gases needed for production of the PN junction devices. The gas flow control system 20 can be operated to precisely control gas species, pressure, and application time interval. This apparatus is sequentially operated to carry out the steps of surface cleaning, impurity adsorption and impurity diffusion.

Figure 3A:
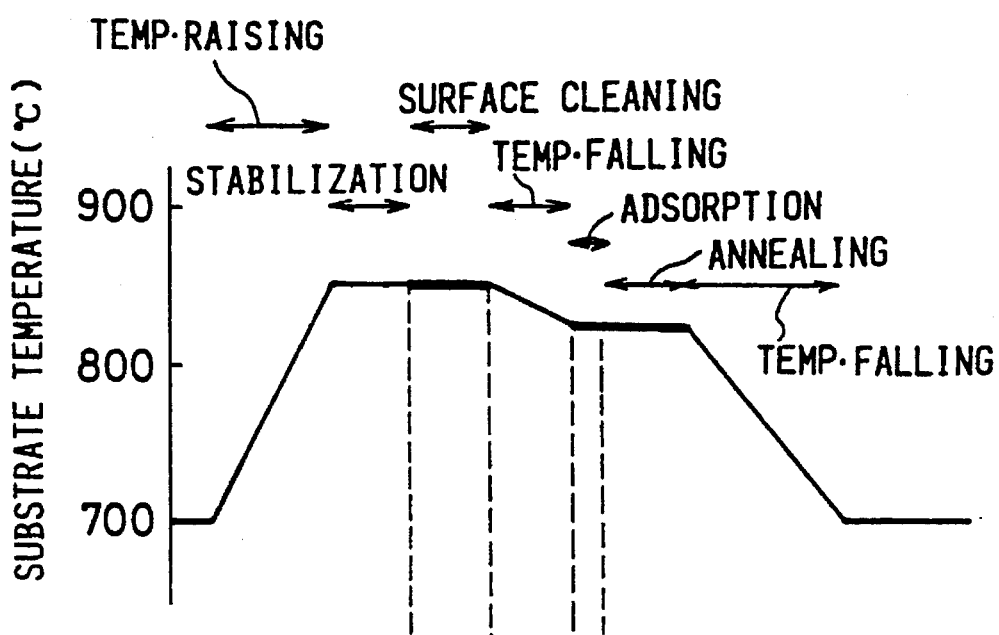
FIG. 3 is a process sequence chart illustrating PN junction device fabrication according to the invention.
Figure 3B:
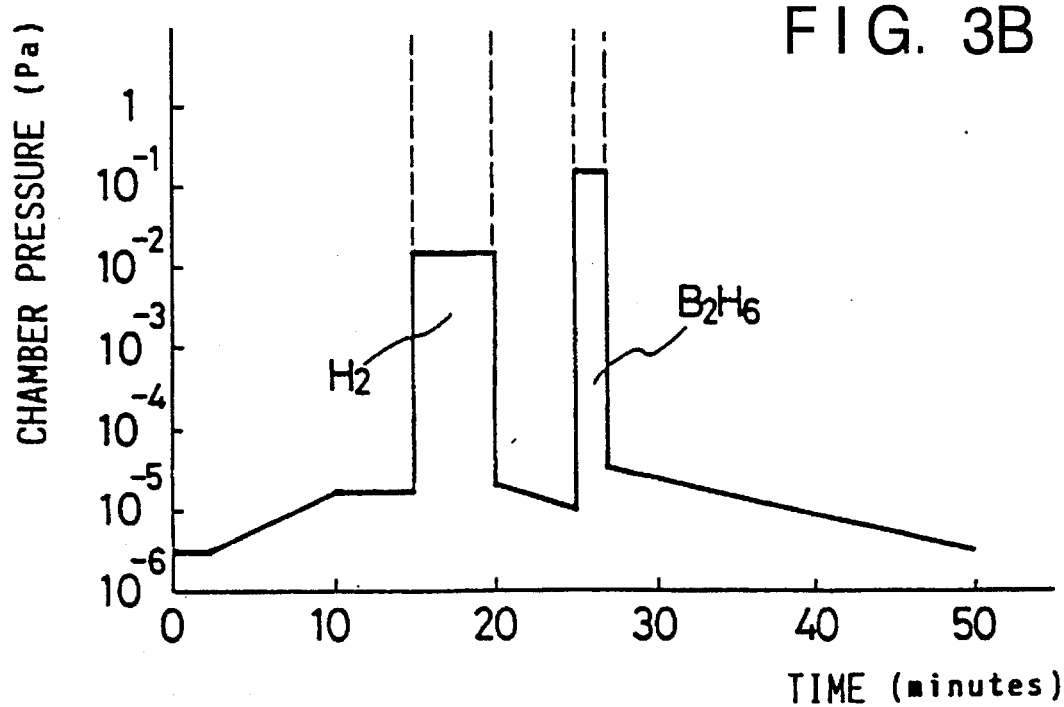

FIG. 3 is an actual process sequence chart for producing a PN junction device as shown in FIGS. 1A–1E by using the production apparatus shown in FIG. 2. In FIG. 3, the horizontal axis indicates processing time, and the vertical axis indicates the substrate temperature and the chamber pressure.

A description will now be given, with reference to FIGS. 2 and 3, of an example of an actual process in which a P type impurity of boron is doped into an N type silicon semiconductor layer to form a P type semiconductor layer.

At first, the surface cleaning is carried out over the N type semiconductor layer formed on a substrate. The substrate is set in the center of vacuum chamber 12, which is held below $1 \times 10^{-4}$ Pa of background pressure, and the substrate temperature is raised to 850° C. When the substrate temperature is held stable at 850° C., hydrogen gas is introduced for a predetermined time interval under the condition that the internal chamber pressure is raised to $1.3 \times 10^{-2}$ Pa. By this operation, a natural oxide film is removed form the surface of the N type semiconductor layer to expose a chemically active silicon face.

Then, the substrate temperature is lowered, for example to 825° C., and an adsorption film composed of elemental boron or boron-containing compound is formed on the chemically active silicon face of the substrate. Namely, after finishing the surface cleaning, the hydrogen gas is stopped, and instead diborane gas ($B_2H_6$) is applied to the active face of the N type semiconductor layer. For example, the application is carried out for a predetermined time interval at a chamber pressure of $1.3 \times 10^{-2}$ Pa so as to deposit an adsorption film composed of boron atoms or a boron-containing compound. In this example, the diborane gas is diluted to a concentration of 5% by $N_2$ carrier gas.

As FIG. 3 shows, between the end of the cleaning step an the start of the absorption film forming step, the internal chamber pressure is lowered, and this pressure is then raised by the introduction of diborane gas.

Lastly, after finishing the deposition of adsorption film, the diborane gas flow is stopped, and then annealing is effected in vacuum. By this treatment, solid-phase diffusion of the impurity is carried out from the diffusion source in the form of the impurity adsorption film to thereby form a P type semiconductor layer in the bulk of the N type semiconductor layer. Concurrently, the impurity atoms are activated in the diffusion region. Consequently, there is formed a PN junction between the N and P type semiconductor layers. According to the invention, the adsorption amount of boron and the annealing conditions such as the heating temperature and heating time of the substrate are controlled so as to form the P type semiconductor layer having a desired impurity density and PN junction depth.

Figure 4:
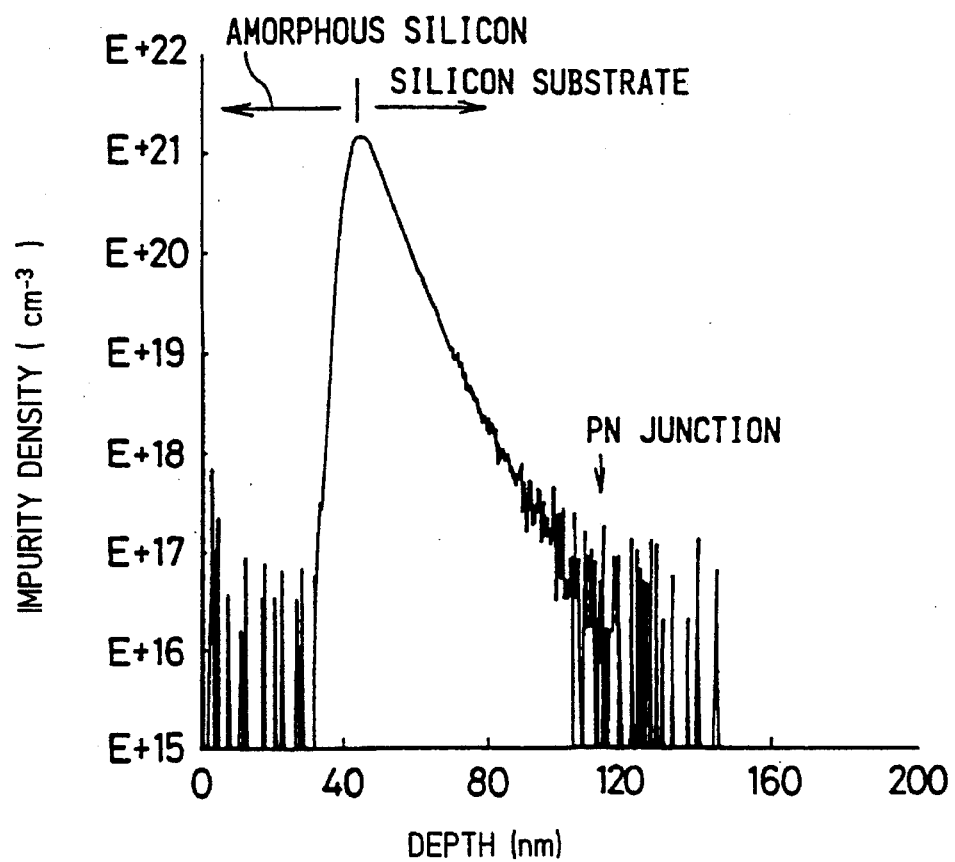
FIG. 4 is a diagram illustrating an impurity density profile in a PN junction region according to the invention.

FIG. 4 shows the impurity density profile of the thus obtained PN junction region. This profile is obtained by using a secondary ion mass spectrometer. The upper surface of the P type semiconductor layer is coated with an amorphous silicon layer having a thickness of about 450Å in order to improve analysis accuracy. Therefore, the original surface level of the P type semiconductor layer is indicated at about 45 nm along the horizontal axis of the FIG. 4 profile. As understood by FIG. 4, the PN junction depth is extremely shallow and is in the range of about 700 Å. The shallow junction can be easily formed to a depth below 0.1µ according to the invention. Further, the diffusion density profile of the P type impurity boron is quite steep in the depth direction so that the formed PN junction region has a small depletion layer width in which the P type region and the N type region are close to each other. Such feature is important for producing a PN junction device having excellent electrical performance.

Figure 5:
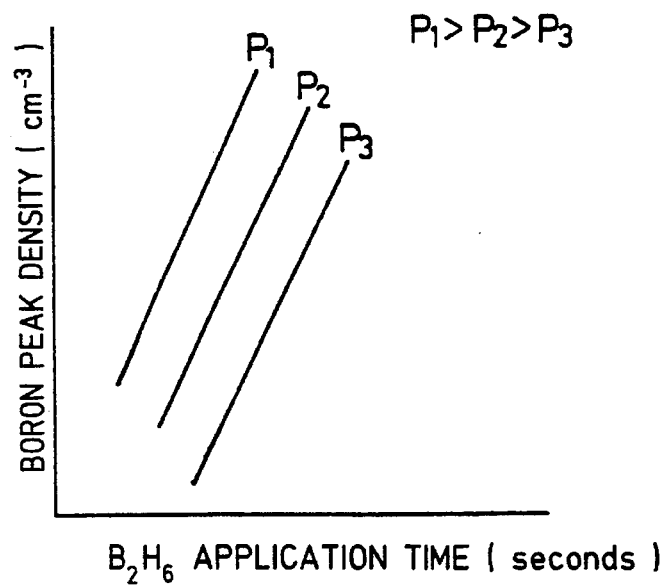
FIG. 5 is a graph showing the relation between boron peak density in the PN junction region and application pressure and application time interval of impurity gas according to the invention.

FIG. 5 is a graph showing the relation between the diffusion peak density of boron in the P type region and the application pressure and time interval of application of the diborane gas. As seen from the graph, the higher the application pressure of the diborane gas, the greater the boron peak density. Further, the longer the application time interval of the diborane gas, the greater the boron peak density. Increasing boron peak density corresponds to increasing the boron adsorption amount. These application parameters of diborane gas can be regulated so as to optimumly control the impurity density in the P type region.

Hereinafter, a detailed description is given for practical methods of producing various types of PN junction devices according to the present invention.

Figure 6A:
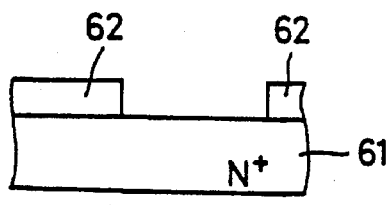
FIGS. 6A–6D are views similar to those of FIG. 1 illustrating basic process steps for producing a PN junction type tunnel rectifier device according to the invention.

FIGS. 6A–6D show a method of producing a PN junction type tunnel rectifier or tunnel diode. In the step of FIG. 6A, a mask 62 is formed on a silicon substrate 61 of $N^+$ type to delimit a device region. The mask 62 is formed by, for example, deposition and etching of a silicon nitride film or silicon oxide film.

Figure 6B:
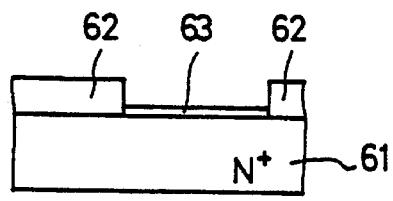

In the step of FIG. 6B, a natural oxide film is removed from the device region of the $N^+$ type silicon substrate 61, and thereafter diborane gas is utilized to form an adsorption film 63 containing boron.

Figure 6C:
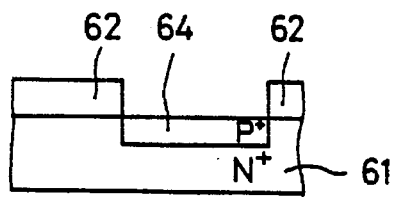

In the step of FIG. 6C, diffusion and activation of the boron impurity are carried out to form a $P^+$ type diffusion region 64 containing a high concentration of the boron impurity, thereby obtaining a $P^+/N^+$ junction.

Figure 6D:
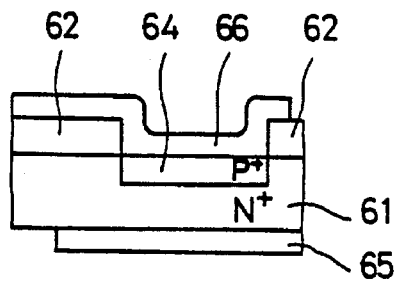

Lastly in the step of FIG. 6D, a pair of electrodes 65 and 66 are patterned to thereby complete a PN junction type tunnel diode.

In this embodiment, the diffusion density profile of boron is quite steep in the depth direction so that the $P^+/N^+$ junction is formed almost with a stepwise depth profile. Consequently, the depletion layer width is extremely narrow to produce a tunneling effect. Namely, application of a low voltage to the pair of electrodes can induce carriers in the extremely narrow depletion region to flow in the form of a tunneling current.

Figure 7A:
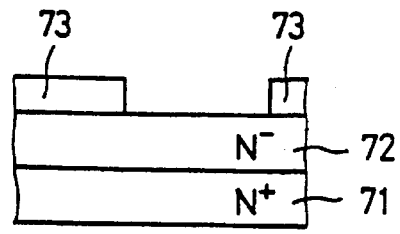
FIGS. 7A–7D are views similar to those of FIG. 1 illustrating basic process steps for producing a PN junction type rectifier device according to the invention.

FIGS. 7A–7D show a method of producing a regular PN junction type rectifier or diode. In the step of FIG. 7A, a mask 73 is formed on a double layer structure of an $N^+$ type region 71 and an N type region 72 to delimit a device region.

Figure 7B:
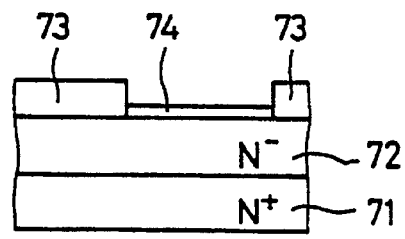

In the step of FIG. 7B, the surface of $N^-$ type region 72 is cleaned to expose an active face. Thereafter, diborane gas is applied to form an impurity film 74 containing boron.

Figure 7C:
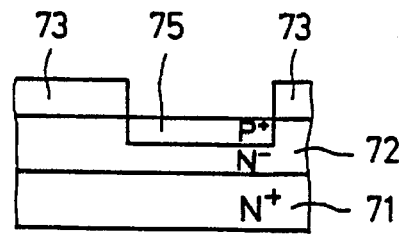

In the step of FIG. 7C, a heating treatment is carried out to effect solid-phase diffusion of the boron impurity into the N' type region 72 to form a $P^+$ type region 75, thereby providing a $P^+/N^-$ junction in the device region. This junction can perform a regular rectifying function. The thus produced $P^+/N^-$ diode has a steep depth profile in the vicinity of the boundary between the $P^+$ type region and $N^-$ type region to thereby suppress expansion of the depletion region toward the $P^+$ region, with the result that the resistivity of the $P^+$ type region has almost no dependency on an applied voltage.

Figure 7D:
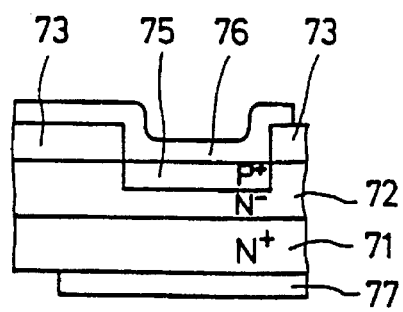

Lastly in the step of FIG. 7D, a pair of electrodes 76 and 77 are patterned to form a PN junction type diode of the regular type.

In this embodiment, doping with the boron impurity is effected concurrently over the entire area of a semiconductor wafer so as to efficiently produce multiple PN junction type diodes throughout the semiconductor wafer. Consequently, through-put of the apparatus using the inventive method is raised as compared to the conventional method using ion implantation. Further, the adsorption amount of the impurity may be increased so as to raise the impurity density in the vicinity of the $P^+$ region surface, thereby reducing contact resistivity.

Figure 8:
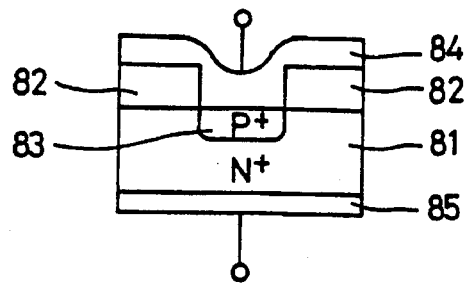
FIG. 8 is a cross-sectional view of a PN junction type capacitor device according to the invention.

FIG. 8 is a cross-sectional vies showing a PN junction type capacitor produced according to the invention. As shown in the FIG. 8, the PN junction type capacitor is comprised of an $N^+$ type silicon substrate 81, a $P^+$ type diffusion region 83 formed according to the invention by doping boron impurity at a high concentration through each opening in a mask 82, and a pair of patterned electrodes 84 and 85.

Figure 9A:
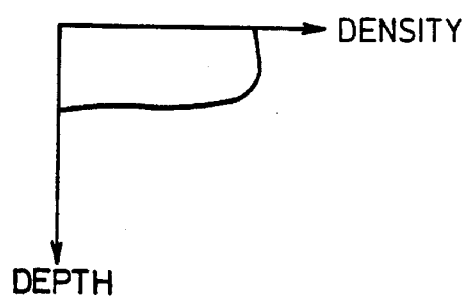
FIGS. 9A and 9B show profiles of impurity distribution according to the invention and according to the prior art, respectively.
Figure 9B:
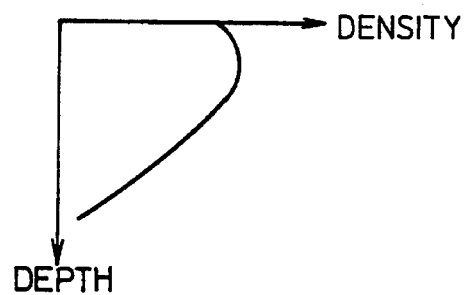

FIG. 9A shows schematically a density distribution profile of the thus doped impurity born in the depth direction. Since the depth profile of the impurity boron varies quite sharply, the $P^+/N^+$ junction has almost a stepwise form between the $P^+$ region 83 and the $N^+$ region 81 so that the depletion region width is quite narrow at the junction boundary. Accordingly, this depletion region can be utilized as an electrostatic capacitance to form a PN junction type capacitor having a capacitance greater than conventional ones. FIG. 9B shows a diffusion density profile of boron impurity doped by the conventional ion implantation for purposes of comparison. This density profile is rather moderate such that $P^+/N^+$ junction has a sloping formed has an effective junction structure of $P^+$, P, $P^-/N^-$, N, $N^+$ from top to bottom. Therefore, the depletion layer width is rather large and its capacitance, which is inversely proportional to depletion layer width, is relatively small. Further, the depletion layer width greatly depends on applied voltage such that the resistivity of $P^+$ layer varies disadvantageously relative to the applied voltage.

Figure 10:
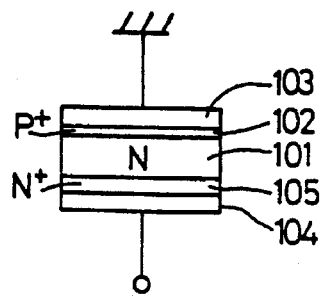
FIG. 10 is a cross-sectional view of a PN junction type photoelectric conversion device according to the invention.

FIG. 10 shows a cross-sectional view of a PN junction type photoelectric converter, i.e. a photodiode, produced according to the invention. As shown in the FIG. 10, a $P^+$ type impurity diffusion layer 102 is formed on an N type silicon substrate 101 to provide a PN junction. The $P^+$ type region 102 is formed by application of diborane gas, adsorption of boron and solid-phase diffusion of boron according to the invention. In this embodiment, adsorption amount of boron is controlled and the diffusion process is carried out for a short interval so as to form an ultra-shallow PN junction. A transparent electrode 103 is formed on the $P^+$ type region 102 to define a light receiving face. Further, an $N^+$ layer 105 is formed on a rear surface of the N type silicon substrate 101 by ion implantation or predeposition diffusion, and a counter electrode 104 is subsequently formed. In this embodiment, the PN junction depth is extremely shallow so as to improve sensitivity to incident light in the shorter wavelength region.

Figure 11:
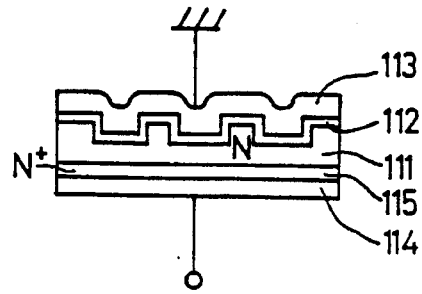
FIG. 11 is a cross-sectional view of another PN junction type photoelectric conversion device according to the invention.

FIG. 11 shows another PN junction type photoelectric converter produced according to the invention. In this embodiment, an N type silicon substrate 111 is provided with an uneven surface, and a $P^+$ type impurity diffusion layer 112 is formed along the uneven surface. According to the invention, doping of boron is based on the chemical adsorption of boron produced by dissociation of diborane gas, hence the inventive doping is nondirectional, in contrast to ion implantation. Therefore, the $P^+$ type diffusion layer 112 is uniformly formed along the uneven surface of the substrate 111. A transparent electrode 113 is formed on the $P^+$ type diffusion layer 112 to define a light receiving face. On the other hand, an $N^+$ type layer 115 is formed on the back of the silicon substrate 111 by means of ion implantation or predeposition diffusion, and a counter electrode 114 is formed on the $N^+$ type layer 115. In this embodiment, the uneven surface is provided on the substrate so as to enlarge the effective area of the light receiving face to thereby improve the optical sensitivity.

In the various above described embodiments, diborane gas is utilized to dope with a P type impurity; however, there may be other effective compounds of group-III elements such as trimethylgallium (TMG) and trichloroboron ($BCl_3$). On the other hand, doping with N type impurity can be carried out by using various source gas compounds such as arsine ($AsH_3$), phosphorus trichloride ($PCl_3$), antimony pentachloride ($SbCl_5$) and phosphine ($PH_3$).

The substrate temperature may be preferably set in the range from 800° C. to 1200° C. for the surface cleaning treatment, and may be preferably set in the range from 400° C. to 950° C. for the adsorption treatment.

While the impurity adsorption film is directly formed on the active face in the disclosed embodiment, a silicon epitaxial growth layer may be interposed as an underlayer. Otherwise, a silicon epitaxial growth layer may be coated on the impurity adsorption film. Further, an adsorption film and an epitaxial film may be alternatively superposed with each other to form a multi-layer structure. These structures can improve the electric conductivity in the impurity diffusion region, and can make the impurity density uniform in the depth direction within the diffusion region.

As described above, according to the invention, a PN junction is formed by solid-phase diffusion from a diffusion source in the form of an impurity adsorption film. Therefore, the PN junction can be provided with a stepwise form, thereby facilitating production of a tunnel diode or a capacitive element. Further, since the inventive method can provide an ultra-shallow PN junction which could not be formed by conventional ion implantation, there can be produced a photodiode having an excellent sensitivity for the shorter wavelength range.

This application relates to subject matter disclosed in Japanese Application No.1-313727, filed on Dec. 1, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing a PN junction device, comprising:

providing a semiconductor layer of a first conductivity type having a surface and provided with an inert film on the surface;

removing the inert film from the surface of the semiconductor layer of the first conductivity type, by a heat treatment at a background pressure of less than $1 \times 10^{-4}$ Pa at the surface of the semiconductor layer to expose an active surface of the semiconductor layer;

applying to the active surface a gas containing an impurity component of a second conductivity type opposite to the first conductivity type and heating the semiconductor layer to a temperature between 400° C. and 950° C. to chemically form an impurity adsorption film constituting a diffusion source on the active surface, wherein the semiconductor layer is maintained continuously in a vacuum after said step of removing and during said step of applying;

carrying out solid-phase diffusion of the impurity component from the diffusion source into the semiconductor layer of the first conductivity type to form another semiconductor layer of the second conductivity type to thereby form a PN junction between the semiconductor layer of the first conductivity type and the other semiconductor layer of the second conductivity type; and connecting a respective electrode to each semiconductor layer.

2. A method according to claim 1 wherein the first semiconductor layer is of silicon and the gas applied in said step of applying is a diborane gas having an impurity component of boron to form an impurity adsorption film containing boron.

3. A method according to claim 1 wherein the PN junction device is a PN junction type diode.

4. A method according to claim 1 wherein the PN junction device is a PN junction type tunnel diode.

5. A method according to claim 1 wherein the PN junction device is a PN junction type photodiode.

6. A method of producing a PN junction device, comprising:

providing a semiconductor layer of a first conductivity type having an uneven surface and provided with an inert film on the surface;

removing the inert film from the uneven surface of the semiconductor layer of the first conductivity type, by a heat treatment to expose an active surface of the semiconductor layer;

applying to the active surface a gas containing an impurity component of a second conductivity type opposite to the first conductivity type and heating the semiconductor layer to a temperature between 400° C. and 950° C. to chemically form an impurity adsorption film constituting a diffusion source on the active surface, wherein said steps of removing and applying are performed sequentially in a vacuum chamber without removing the semiconductor layer from the chamber;

carrying out solid-phase diffusion of the impurity component from the diffusion source into the uneven surface of the semiconductor layer of the first conductivity type to form another semiconductor layer of the second conductivity type to thereby form a PN junction between the semiconductor layer of the first conductivity type and the other semiconductor layer of the second conductivity type; and connecting a respective electrode to each semiconductor layer.

7. A method as defined in claim 1 wherein said step of removing the inert film by a heat treatment is carried out at a temperature between 800° C. and 1200°C.

8. A method as defined in claim 6 wherein said step of removing the inert film by a heat treatment is carried out at a temperature between 800° C. and 1200° C.

* * * * *